United States Patent
Misumi et al.

(10) Patent No.: US 7,232,709 B2
(45) Date of Patent: Jun. 19, 2007

(54) PROCESS FOR PRODUCING A SEMICONDUCTOR DEVICE

(75) Inventors: Sadahito Misumi, Ibaraki (JP); Takeshi Matsumura, Ibaraki (JP); Kazuhito Hosokawa, Ibaraki (JP); Hiroyuki Kondou, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 247 days.

(21) Appl. No.: 11/012,377

(22) Filed: Dec. 15, 2004

(65) Prior Publication Data

US 2005/0156321 A1 Jul. 21, 2005

(30) Foreign Application Priority Data

Dec. 19, 2003 (JP) .............................. 2003-423118

(51) Int. Cl.
H01L 21/00 (2006.01)
(52) U.S. Cl. ...................................... 438/118; 438/119
(58) Field of Classification Search ................ 438/118, 438/119, 617, 124, 125, 126, 127
See application file for complete search history.

(56) References Cited

U.S. PATENT DOCUMENTS

| 5,411,921 | A | 5/1995 | Negoro |
| 5,894,983 | A | 4/1999 | Beck et al. |
| 6,558,975 | B2 * | 5/2003 | Sugino et al. ................. 438/64 |
| 2002/0079567 | A1 | 6/2002 | Lo et al. |
| 2002/0121680 | A1 | 9/2002 | Ahn et al. |
| 2005/0224821 | A1 * | 10/2005 | Sakano et al. ................. 257/79 |
| 2005/0224978 | A1 * | 10/2005 | Kawate et al. ............... 257/753 |
| 2005/0253286 | A1 * | 11/2005 | Yoshikawa et al. ......... 257/787 |

FOREIGN PATENT DOCUMENTS

| DE | 198 03 407 A1 | 2/1999 |
| EP | 0 535 433 A2 | 4/1993 |
| EP | 0 571 649 A1 | 12/1993 |
| JP | 55-111151 | 8/1980 |
| JP | 59-3779 | 1/1984 |
| JP | 2-44751 | 2/1990 |
| JP | 3-222441 | 10/1991 |
| JP | 7-102225 | 4/1995 |
| JP | 8-255803 | 10/1996 |

(Continued)

OTHER PUBLICATIONS

Japanese Office Action issued on the corresponding Japanese Patent Application No. 2003-423118, dated Jan. 29, 2007.

*Primary Examiner*—S. V. Clark
(74) *Attorney, Agent, or Firm*—Knobbe Martens Olson & Bear LLP

(57) ABSTRACT

The process for producing a semiconductor device according to the invention comprises a pre-sticking/fixing step of pre-sticking/fixing a semiconductor element through an adhesive sheet to an object to which the semiconductor element is to be stuck/fixed, and a wire bonding step of performing wire bonding without heating step, wherein the shear adhesive force of the adhesive sheet to the object is 0.2 MPa or more at the time of the pre-sticking/fixing. This makes it possible to a semiconductor device producing process wherein a drop in the yield of semiconductor devices is suppressed and steps therein are made simple; an adhesive sheet used in this process; and a semiconductor device obtained by the process.

15 Claims, 13 Drawing Sheets

FOREIGN PATENT DOCUMENTS

| | | |
|---|---|---|
| JP | 11-67699 | 3/1999 |
| JP | 2000-104040 | 4/2000 |
| JP | 2001-81439 | 3/2001 |
| JP | 2001-313301 | 11/2001 |
| JP | 2002-105428 | 4/2002 |
| JP | 2002-158276 | 5/2002 |
| JP | 2002-179769 | 6/2002 |
| JP | 2002-261233 | 9/2002 |
| JP | 2003-264205 | 9/2003 |

* cited by examiner

PROCESS FOR PRODUCING A SEMICONDUCTOR DEVICE

FIELD OF THE INVENTION

The present invention relates to a process for producing a semiconductor device, an adhesive sheet used in the process, and a semiconductor device obtained by the process.

BACKGROUND OF THE INVENTION

In order to meet the request that semiconductor devices are made finer and caused to have higher functions, the wiring width of power supply lines arranged in the entire area of the main faces of their semiconductor chips (semiconductor elements) or the interval between signal lines arranged therein has been becoming narrower. For this reason, the impedance thereof increases or signals between signal lines of different nodes interfere with each other so as to cause hindrance to the exhibition of sufficient performances for the operation speed of the semiconductor chips, the margin of the operating voltage thereof, the resistance thereof against damage by electrostatic discharge, and others. In order to solve these problems, package structures wherein semiconductor elements are laminated are suggested (see JP-A-55-111151 and JP-A-2002-261233).

As a material used to stick semiconductor elements to a substrate or the like, the following examples are suggested: an example wherein a thermosetting paste resin is used (see, for example, JP-A-2002-179769); and examples wherein an adhesive sheet composed of a thermoplastic resin and a thermosetting resin is used (see, for example, JP-A-2000-104040 and JP-A-2002-261233).

In conventional processes for producing a semiconductor device, an adhesive sheet or an adhesive is used to adhere semiconductor elements onto a substrate, a lead frame or semiconductor elements. The adhesion is performed by attaching the semiconductor elements to the substrate or the like under pressure (die attaching) and then curing the adhesive sheet or the like in a heating step. Furthermore, wire bonding is performed in order to connect the semiconductor elements electrically to the substrate or the like. Thereafter, a sealing resin is molded onto the resultant product, and post-cured to perform sealing based on the sealing resin.

However, when the wire bonding is performed, the semiconductor elements on the substrate or the like are shifted by ultrasonic vibration or heating. Conventionally, therefore, it is necessary to perform a heating step before the wire bonding so as to heat and cure the thermosetting paste resin or thermosetting adhesive sheet, thereby sticking/fixing the semiconductor elements so as not to be shifted.

An adhesive sheet made of a thermoplastic resin or an adhesive sheet composed of a thermosetting resin and a thermoplastic resin is required to undergo a heating step after die attaching and before wire bonding in order to ensure adhesive force thereof onto an object which is to be stuck with the sheet, or improve the wettability thereof onto the object.

SUMMARY OF THE INVENTION

However, there is caused a problem that volatile gas is generated from the adhesive sheet or the like by the heating thereof which is performed before wire bonding. The volatile gas contaminates bonding pads. Thus, no wire bonding will be able to be carried out in many cases.

By heating and curing the adhesive sheet or the like, curing, shrinking or the like is caused in the adhesive sheet or the like. With this, stress is generated so as to result in a problem that a warpage is generated in the lead frame or the substrate stuck on the sheet (as well as the semiconductor elements). Additionally, a problem that a crack is generated in the semiconductor elements on the basis of the stress is caused in a wire bonding step. In recent years, the thickness of semiconductor elements has been made smaller from a conventional thickness of about 200 μm to a smaller value, in particular, to a thickness of 100 μm or less as the semiconductor elements have been made thinner and smaller. Considering this situation, the problems about the warpage of the substrate or the like or the crack in the semiconductor elements are more serious. Thus, it is increasingly becoming important to solve the problems.

In light of the above-mentioned problems, the present invention has been made. An object thereof is to provide a process for producing a semiconductor device which gives an improved yield and has simplified steps; an adhesive sheet used in this process; and a semiconductor device obtained by this method.

In order to solve the above-mentioned problems, the process for producing a semiconductor device according to the present invention comprises a pre-sticking/fixing step of pre-sticking/fixing a semiconductor element through an adhesive sheet to an object to which the semiconductor element is to be stuck/fixed, and a wire bonding step of performing wire bonding without heating step, wherein the shear adhesive force of the adhesive sheet to the object is 0.2 MPa or more at the time of the pre-sticking/fixing.

The object is preferably a substrate, a lead frame or a semiconductor element.

The process for producing a semiconductor device of the present invention may comprise a sealing step of sealing the semiconductor element with a sealing resin, and a post-curing step of post-curing the sealing resin, wherein the sealing resin can be cured by heating and further the semiconductor element can be stuck/fixed to the object through the adhesive sheet in the sealing step and/or the post-curing step.

When the object is a semiconductor element, the process of the present invention preferably comprises the step of inserting a spacer between this semiconductor element and the above-mentioned semiconductor element in such a manner that the adhesive sheet is interposed between each of the semiconductor elements and the spacer, wherein the shear adhesive force of the adhesive sheet to the spacer or the semiconductor element is 0.2 MPa or more at the time of the pre-sticking/fixing.

In the sealing step and/or the post-curing step, the sealing resin can be cured by heating and further the above-mentioned semiconductor element can be stuck/fixed to the spacer through the adhesive sheet.

The wire bonding step is preferably performed at a temperature in the range of 80 to 250° C.

As the adhesive sheet, a sheet comprising a thermoplastic resin can be used. As the adhesive sheet, a sheet comprising both of a thermosetting resin and a thermoplastic resin can be used.

As the thermosetting resin, an epoxy resin and/or a phenol resin preferably is/are used. As the thermoplastic resin, an acrylic resin is preferably used.

In the case that a sheet comprising both of a thermosetting resin and a thermoplastic resin is used as the adhesive sheet, the sheet to which a crosslinking agent is also added is preferably used.

In order to solve the above-mentioned problems, the adhesive sheet according to the present invention is an adhesive sheet used in a process for producing a semiconductor device which comprises a pre-sticking/fixing step of pre-sticking/fixing a semiconductor element through the adhesive sheet to an object to which the semiconductor element is to be stuck/fixed, and a wire bonding step of performing wire bonding without heating step, wherein the shear adhesive force of the adhesive sheet to the object is 0.2 MPa or more at the time of the pre-sticking/fixing.

In order to solve the above-mentioned problems, the semiconductor device according to the present invention is a semiconductor device obtained by a semiconductor device producing process which comprises a pre-sticking/fixing step of pre-sticking/fixing a semiconductor element through an adhesive sheet to an object to which the semiconductor element is to be stuck/fixed, and a wire bonding step of performing wire bonding without heating step, and which uses, as the adhesive sheet, a sheet having a shear adhesive force to the object of 0.2 MPa or more at the time of the pre-sticking/fixing.

According to the present invention, the shear adhesive force of the adhesive sheet to the object is 0.2 MPa or more at the time of the pre-sticking/fixing; therefore, even if the step of heating the adhesive sheet is omitted to carry out the wire bonding step, no shear deformation is generated in the adhesion face between the adhesive sheet and the object by ultrasonic vibration or heating in the wire bonding step. For this reason, the wire bonding can be attained with a drop in the yield thereof being suppressed.

In conventional producing processes, an adhesive sheet is heated before a wire bonding step. The heating causes a volatile gas to be generated from the adhesive sheet, so that the bonding pads may be contaminated. In the invention, however, such a step is unnecessary. Thus, the yield of semiconductor devices can be improved. Furthermore, the step of heating the adhesive sheet is omitted, whereby the substrate or the like (as the object) is not warped or the semiconductor element is not cracked. As a result, the semiconductor element can be made even thinner.

The sticking/fixing of the adhesive sheet, as well as the heating of the sealing resin, can be attained in the resin-sealing step of sealing the sealing resin, and/or in the step of post-curing the sealing resin after the resin-sealing step. Accordingly, the producing process can be made simple.

Since the wire bonding step is performed at 80 to 250° C. for several seconds to several minutes, the semiconductor element and the object are not completely stuck/fixed to each other through the adhesive sheet in this step.

As the adhesive sheet, a sheet comprising a thermoplastic resin can be used, or a sheet comprising both of a thermosetting resin and a thermoplastic resin can be used.

As the thermosetting resin, an epoxy resin and/or a phenol resin is/are preferably used. As the thermoplastic resin, an acrylic resin is preferably used. Since these resins contain ionic impurities in only a small amount and have high heat resistance, the reliability of the semiconductor element can be ensured.

As the adhesive sheet, a sheet to which a crosslinking agent is added is preferably used.

The same effects and advantages as described above are produced in the case of laminating, over the above-mentioned semiconductor element, one or more semiconductor elements so as to interpose the same adhesive sheet(s) as described above between the semiconductor elements, or in the case of inserting a spacer between the above-mentioned semiconductor element and a semiconductor element as the above-mentioned object in such a manner that the adhesive sheet is interposed between each of the semiconductor elements and the spacer. The above-mentioned simplification of the producing process makes it possible to make the producing-efficiency of plural semiconductor elements or the like which are three-dimensional mounted even higher.

BRIEF DESCRIPTION OF THE DRAWINGS

Other objects, features and superior points of the present invention will be sufficiently understood from the following description. The advantages of the present invention will be made clear from the following description with reference to the attached drawings.

DESCRIPTION OF THE EMBODIMENTS (Embodiment) 1

An embodiment of the present invention is described with reference to FIGS. 1($a$) to 1($c$), which are process charts for explaining a process for producing a semiconductor device according to the present embodiment. In the Figures, however, parts or portions unnecessary for the explanation are omitted and some parts or portions are enlarged, scaled down or modified to make the explanation easily. The same matter is applied to the other drawings.

The semiconductor device producing process according to the present embodiment comprises a pre-sticking/fixing step of pre-sticking/fixing a semiconductor element 13 through an adhesive sheet 12 onto a substrate or lead frame (an object onto which the semiconductor element is to be stuck/fixed) 11, which will referred to merely as the "substrate 11 or the like" hereinafter, and a wire bonding step of performing wire bonding without heating step. This process further comprises a sealing step of sealing the semiconductor element 13 with a sealing resin 15, and a post-curing step of post-curing the sealing resin 15.

Figure 1A:
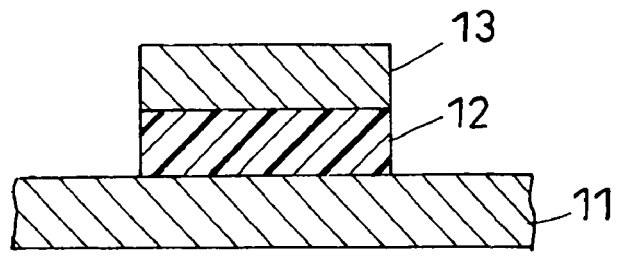
FIGS. 1($a$) to 1($c$) are process charts for explaining a process for producing a semiconductor device according to embodiment 1 of the present invention.

As illustrated in FIG. 1($a$), the pre-sticking/fixing step is a step of pre-sticking/fixing the semiconductor element 13 through the adhesive sheet 12 onto the substrate 11 or the like. The method for pre-sticking/fixing the semiconductor substrate 13 onto the substrate 11 or the like may be, for example, a method of laminating the adhesive sheet 12 onto the substrate 11 or the like and subsequently laminating and pre-sticking/fixing the semiconductor element 13 on the adhesive sheet 12 in such a manner that the wire bonding face of the semiconductor element 13 is directed upwards. The semiconductor element 13 on which the adhesive sheet 12 is beforehand pre-stuck/fixed may be pre-stuck/fixed onto the substrate 11 or the like.

The substrate may be any substrate known in the prior art. The lead frame may be a metal lead frame such as a Cu lead frame or a 42-alloy lead frame; or an organic substrate made of glass epoxy resin, BT (bismaleimide-triazine), polyimide or the like. In the present invention, however, the substrate is not limited to these substrates, and may be a circuit substrate that can be used in the state that a semiconductor element is mounted on the substrate itself and is electrically connected thereto.

The adhesive sheet 12 may be a adhesive sheet, the shear adhesive force of which to the substrate 11 or the like is 0.2 MPa or more, preferably from 0.2 to 10 MPa, at the time of the pre-sticking/fixing. The shear adhesive force of the adhesive sheet 12 is at least 0.2 MPa; therefore, even if a wire bonding step is performed without heating step, no shear deformation is generated in the adhesion face between the adhesive sheet 12 and the semiconductor element 13 or the substrate 11 or the like by ultrasonic vibration or heating in the wire bonding step. In other words, the semiconductor element is not shifted by ultrasonic vibration generated at the time of the wire bonding step, thereby preventing a drop in the success ratio of the wire bonding. The adhesive sheet 12 will be described in detail later.

Figure 1B:
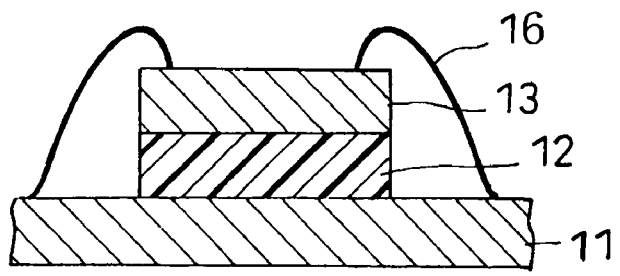

The wire bonding step is a step of electrically connecting the tips of terminal portions (inner leads) of the substrate 11 or the like to electrode pads (not illustrated) on the semiconductor element 13 through bonding wires 16 (see FIG. 1(b)). The bonding wires 16 may be, for example, gold lines, aluminum lines, or copper lines. The temperature when the wire bonding is performed is from 80 to 250° C., preferably from 80 to 220° C. The time for the heating is from several seconds to several minutes. The bonding is performed by use of both of vibration energy based on ultrasonic waves and pressing energy based on applied pressure in the state that the semiconductor element 13 and the substrate 11 or the like are heated into the above-mentioned temperature range.

The present step is carried out without performing sticking/fixing based on the adhesive sheet 12. In the present step, the semiconductor element 13 is not stuck/fixed onto the substrate 11 or the like through the adhesive sheet 12. Even if the temperature for the wire bonding is in the range of 80 to 250° C., the shear adhesive force of the adhesive sheet 12 needs to be 0.2 MPa or more. If the shear adhesive force is less than 0.2 MPa within this temperature range, the semiconductor element is shifted by ultrasonic vibration at the time of the wire bonding. As a result, the wire bonding cannot be performed to give a low yield.

Figure 1C:
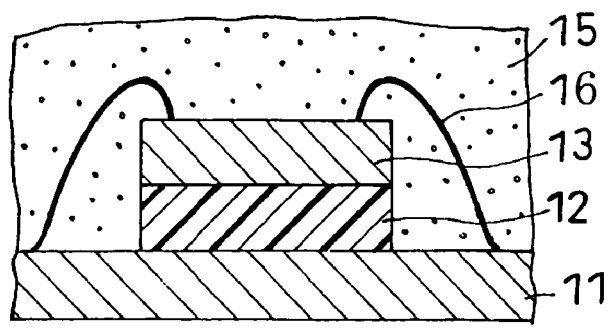

The above-mentioned sealing step is a step of sealing the semiconductor element 13 with a sealing resin 15 (see FIG. 1(c)), and is performed to protect the semiconductor element 13 and the bonding wires 16 mounted on the substrate 11 or the like. The present step is performed by molding the sealing resin with a mold or die. The sealing resin 15 may be, for example, an epoxy resin. The heating for the resin-sealing is performed usually at 175° C. for 60 to 90 seconds. In the this invention, however, the heating is not limited to this, and may be performed, for example at 165 to 185° C. for several minutes. In such a way, the sealing resin is cured and further the semiconductor element 13 and the substrate 11 or the like are stuck/fixed to each other through the adhesive sheet 12. In short, even if the post-curing step, which will be detailed later, is not performed in this invention, the sticking/fixing based on the adhesive sheet 12 can be attained in the present step so that the number of the producing steps can be reduced and the term for producing the semiconductor device can be shortened.

In the post-curing step, the sealing resin 15, which is not sufficiently cured in the sealing step, is completely cured. Even if the semiconductor element 13 and the substrate 11 or the like are not stuck/fixed to each other through the adhesive sheet 12 in the sealing step, the sealing resin 15 is cured and further they are stuck/fixed through the adhesive sheet 12 in the present step. The heating temperature in the present step is varied dependently on the kind of the sealing resin, and is, for example, in the range of 165 to 185° C. The heating time is from about 0.5 to 8 hours.

The following describes the adhesive sheet 12 in detail. The adhesive sheet 12 may have any structure that can give a shear adhesive force of 0.2 MPa or more at the time of the wire bonding. Specific examples thereof include an adhesive sheet made only of a single adhesive layer, and a multi-layered adhesive sheet wherein an adhesive layer or adhesive layers is/are formed on a single face or both faces of a core member. Examples of the core member include films (such as polyimide, polyester, polyethylene terephthalate, polyethylene naphthalate, and polycarbonate films); resin substrates which are reinforced with glass fiber or plastic nonwoven finer; silicon substrates; and glass substrates. The core member may be a member wherein an adhesive sheet is integrated with a dicing sheet.

The adhesive layer is a layer having an adhesive function, and the constituent material thereof may be a material composed of a thermoplastic resin and a thermosetting resin, or a material made only of a thermoplastic resin.

Examples of the thermoplastic resin include natural rubber, butyl rubber, isoprene rubber, chloroprene rubber, ethylene/vinyl acetate copolymer, ethylene/acrylic acid copolymer, ethylene/acrylic ester copolymer, polybutadiene resin, polycarbonate resin, thermoplastic polyimide resin, polyamide resins such as 6-nylon and 6,6-nylon, phenoxy resin, acrylic resin, saturated polyester resins such as PET and PBT, polyamideimide resin, and fluorine-contained resin. These thermoplastic resins may be used alone or in combination of two or more thereof. Of these thermoplastic resins, acrylic resin is particularly preferable since the resin contains ionic impurities in only a small amount and has a high heat resistance so as to make it possible to ensure the reliability of the semiconductor element.

The acrylic resin is not limited to any especial kind, and may be, for example, a polymer comprising, as a component or components, one or more esters of acrylic acid or methacrylic acid having a linear or branched alkyl group having 30 or less carbon atoms, in particular, 4 to 18 carbon atoms. Examples of the alkyl group include methyl, ethyl, propyl, isopropyl, n-butyl, t-butyl, isobutyl, amyl, isoamyl, hexyl, heptyl, cyclohexyl, 2-ethylhexyl, octyl, isooctyl, nonyl, isononyl, decyl, isodecyl, undecyl, lauryl, tridecyl, tetradecyl, stearyl, octadecyl, and dodecyl groups.

A different monomer which constitutes the above-mentioned polymer is not limited to any especial kind, and examples thereof include carboxyl-containing monomers such as acrylic acid, methacrylic acid, carboxyethyl acrylate, carboxypentyl acrylate, itaconic acid, maleic acid, fumaric acid, and crotonic acid; acid anhydride monomers such as maleic anhydride and itaconic anhydride; hydroxyl-containing monomers such as 2-hydroxyethyl (meth)acrylate, 2-hydroxypropyl(meth)acrylate, 4-hydroxybutyl (meth)acrylate, 6-hydroxyhexyl(meth)acrylate, 8-hydroxyoctyl (meth)acrylate, 10-hydroxydecyl(meth)acrylate, 12-hydroxylauryl (meth)acrylate, and (4-hydroxymethylcyclohexyl)methylacrylate; monomers which contain a sulfonic acid group, such as styrenesulfonic acid, allylsulfonic acid, 2-(meth)acrylamide-2-methylpropanesulfonic acid, (meth)acrylamidepropane sulfonic acid, sulfopropyl (meth)acrylate, and (meth)acryloyloxynaphthalenesulfonic acid; and monomers which contain a phosphoric acid group, such as 2-hydroxyethylacryloyl phosphate.

Examples of the above-mentioned thermosetting resin include phenol resin, amino resin, unsaturated polyester resin, epoxy resin, polyurethane resin, silicone resin, and thermosetting polyimide resin. These resins may be used alone or in combination of two or more thereof. Particularly preferable is epoxy resin, which contains ionic impurities which corrode semiconductor elements in only a small amount. As the curing agent of the epoxy resin, phenol resin is preferable.

The epoxy resin may be any epoxy resin that is ordinarily used as an adhesive composition. Examples thereof include bifunctional or polyfunctional epoxy resins such as bisphenol A type, bisphenol F type, bisphenol S type, brominated bisphenol A type, hydrogenated bisphenol A type, bisphenol AF type, biphenyl type, naphthalene type, fluorene type, phenol Novolak type, orthocresol Novolak type, tris-hydroxyphenylmethane type, and tetraphenylolethane type epoxy resins; hydantoin type epoxy resins; tris-glycicylisocyanurate type epoxy resins; and glycidylamine type epoxy resins. These may be used alone or in combination of two or more thereof. Among these epoxy resins, particularly preferable are Novolak type epoxy resin, biphenyl type epoxy resin, tris-hydroxyphenylmethane type epoxy resin, and tetraphenylolethane type epoxy resin, since these epoxy resins are rich in reactivity with phenol resin as an agent for curing the epoxy resin and are superior in heat resistance and so on.

The phenol resin is a resin acting as a curing agent for the epoxy resin. Examples thereof include Novolak type phenol resins such as phenol Novolak resin, phenol aralkyl resin, cresol Novolak resin, tert-butylphenol Novolak resin and nonylphenol Novolak resin; resol type phenol resins; and polyoxystyrenes such as poly(p-oxystyrene). These may be used alone or in combination of two or more thereof. Among these phenol resins, phenol Novolak resin and phenol aralkyl resin are particularly preferable, since the connection reliability of the semiconductor device can be improved.

About the blend ratio between the epoxy resin and the phenol resin, for example, the phenol resin is blended with the epoxy resin in such a manner that the hydroxyl groups in the phenol resin is preferably from 0.5 to 2.0 equivalents, more preferably from 0.8 to 1.2 equivalents per equivalent of the epoxy groups in the epoxy resin component. If the blend ratio between the two is out of the range, curing reaction therebetween does not advance sufficiently so that properties of the cured epoxy resin easily deteriorate.

In the present invention, an adhesive sheet comprising the epoxy resin, the phenol resin, and an acrylic resin is particularly preferable. Since these resins contain ionic impurities in only a small amount and have high heat resistance, the reliability of the semiconductor element can be ensured. About the blend ratio in this case, the amount of the mixture of the epoxy resin and the phenol resin is from 10 to 200 parts by weight for 100 parts by weight of the acrylic resin component.

In order to crosslink the adhesive sheet 12 of the present invention to some extent in advance, it is preferable to add, as a crosslinking agent, a polyfunctional compound which reacts with functional groups of molecular chain terminals of the above-mentioned polymer to the materials used when the sheet 12 is produced. In this way, the adhesive property of the sheet at high temperatures is improved so as to improve the heat resistance.

The crosslinking agent may be one known in the prior art. Particularly preferable are polyisocyanate compounds, such as tolylene diisocyanate, diphenylmethane diisocyanate, p-phenylene diisocyanate, 1,5-naphthalene diisocyanate, and adducts of polyhydric alcohol and diisocyanate. The amount of the crosslinking agent to be added is preferably set to 0.05 to 7 parts by weight for 100 parts by weight of the above-mentioned polymer. If the amount of the crosslinking agent to be added is more than 7 parts by weight, the adhesive force is unfavorably lowered. On the other hand, if the adding amount is less than 0.05 part by weight, the cohesive force is unfavorably insufficient. A different polyfunctional compound, such as an epoxy resin, together with the polyisocyanate compound may be incorporated if necessary.

An inorganic filler may be appropriately incorporated into the adhesive sheet 12 of the present invention in accordance with the use purpose thereof. The incorporation of the inorganic filler makes it possible to confer electric conductance to the sheet, improve the thermal conductivity thereof, and adjust the elasticity. Examples of the inorganic fillers include various inorganic powders made of the following: a ceramic such as silica, clay, plaster, calcium carbonate, barium sulfate, aluminum oxide, beryllium oxide, silicon carbide or silicon nitride; a metal such as aluminum, copper, silver, gold, nickel, chromium, lead, tin, zinc, palladium or solder, or an alloy thereof; and carbon. These may be used alone or in combination of two or more thereof. Among these, silica, in particular fused silica is preferably used. The average particle size of the inorganic filler is preferably from 0.1 to 80 μm.

The amount of the inorganic filler to be incorporated is preferably set into the range of 0 to 80% by weight (more preferably, 0 to 70% by weight) for 100 parts by weight of the organic resin components.

If necessary, other additives besides the inorganic filler may be incorporated into the adhesive sheet 12 of the present invention. Examples thereof include a flame retardant, a silane coupling agent, and an ion trapping agent.

Examples of the flame retardant include antimony trioxide, antimony pentaoxide, and brominated epoxy resin. These may be used alone or in combination of two or more thereof.

Examples of the silane coupling agent include β-(3,4-epoxycyclohexyl)ethyltrimethoxysilane, γ-glycidoxypropyltrimethoxysilane, and γ-glycidoxypropylmethyldiethoxysilane. These may be used alone or in combination of two or more thereof.

Examples of the ion trapping agent include hydrotalcite and bismuth hydroxide. These may be used alone or in combination of two or more thereof.

(Embodiment) 2

A process for producing a semiconductor device according to embodiment 2 is described with reference to FIGS. 2(a) to 2(e), which are process charts for explaining this process.

The semiconductor device according to the present embodiment is different from the semiconductor device according to the above-mentioned embodiment 1 in that plural semiconductor elements are laminated to be three-dimensionally mounted. More specifically, the present embodiment comprises the step of laminating, on a semiconductor element, another semiconductor element through the adhesive sheet as described above, which is different from the embodiment 1.

Figure 2A:
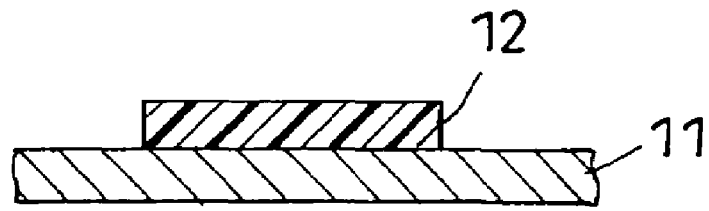
FIGS. 2($a$) to 2($e$) are process charts for explaining a process for producing a semiconductor device according to embodiment 2 of the present invention.
Figure 2B:
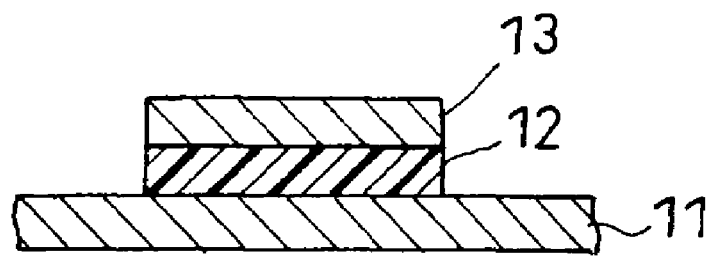
Figure 2C:
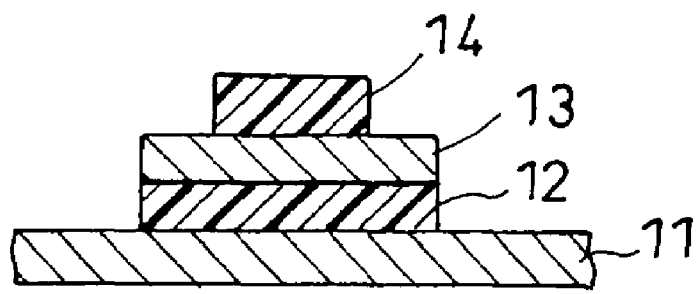
Figure 2D:
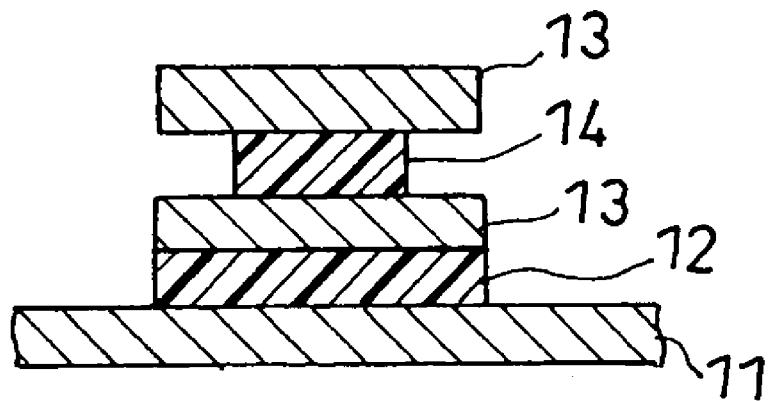

First, as illustrated in FIG. 2(a), at least one adhesive sheet 12, which is cut into a given size, is pre-stuck/fixed onto a substrate 11 or the like, which is an object on which the sheet 12 is to be stuck/fixed. Next, a semiconductor element 13 is pre-stuck/fixed onto the adhesive sheet 12 so that the wire bonding face thereof is directed upwards (see FIG. 2(b)). Furthermore, an adhesive sheet 14 is pre-stuck/fixed onto the semiconductor element 13 to avoid electrode pad portions of the element 13 (see FIG. 2(c)). Another semiconductor element 13 is then formed on the adhesive sheet 14 so that the wire bonding face thereof is directed upwards (see FIG. 2(d)).

Figure 2E:
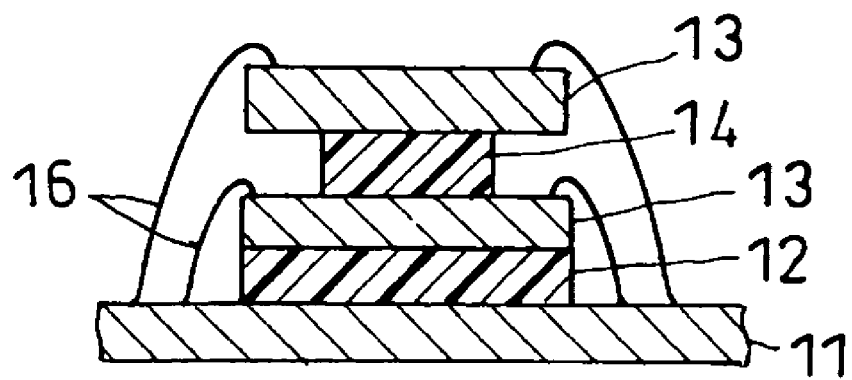

Next, as illustrated in FIG. 2(e), a wire bonding step is carried out without performing any heating step, thereby electrically connecting electrode pads of the semiconductor elements 13 to the substrate 11 or the like through bonding wires 16.

Next, a sealing step of sealing the semiconductor elements 13 with a sealing resin is performed to cure the sealing resin and further to stick/fix the substrate 11 or the like onto one of the semiconductors 13 and stick/fix the semiconductor elements 13 each other through the adhesive sheets 12 and 14. After the sealing step, a post-curing step may be performed.

According to the present embodiment, about the three-dimensional mounting of the semiconductor elements, the production steps thereof can be made simple and the yield thereof can be improved as well, since no heating step based on the heating of the adhesive sheets 12 and 14 is performed. The semiconductor elements can be made even thinner, since the substrate 11 or the like is not warped and the semiconductor elements 13 are not cracked.

(Embodiment) 3

A process for producing a semiconductor device according to embodiment 3 is described with reference to FIGS. 3(a) to 3(g), which are process charts for explaining this process.

The semiconductor device according to the present embodiment is different from the semiconductor device related to the embodiment 2 in that a spacer is inserted between laminated semiconductor elements. More specifically, the present embodiment comprises the step of inserting a spacer between semiconductor elements in such a manner that an adhesive sheet is interposed between the spacer and each of the semiconductor elements, which is different from the embodiment 2.

Figure 3A:
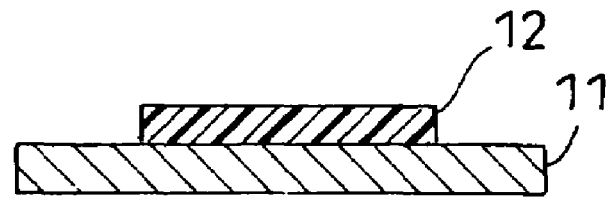
FIGS. 3($a$) to 3($g$) are process charts for explaining a process for producing a semiconductor device according to embodiment 3 of the present invention.
Figure 3B:
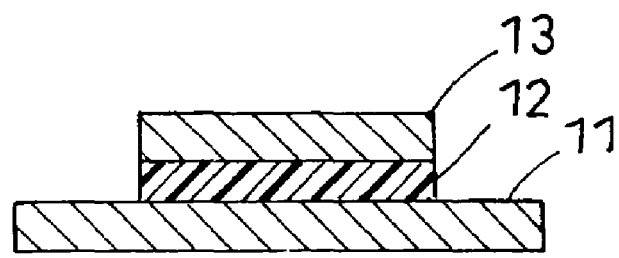
Figure 3C:
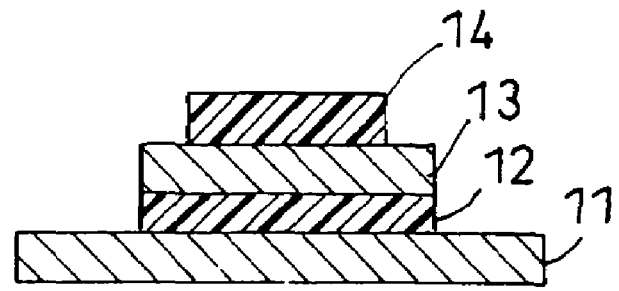
Figure 3D:
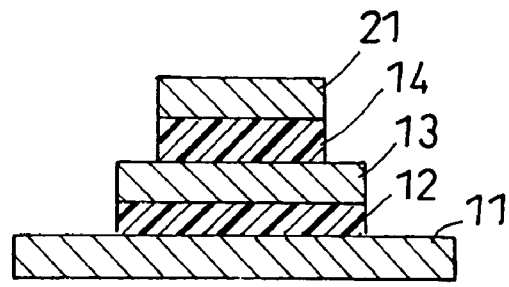
Figure 3E:
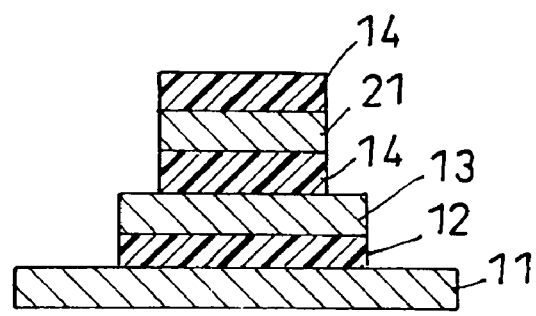
Figure 3F:
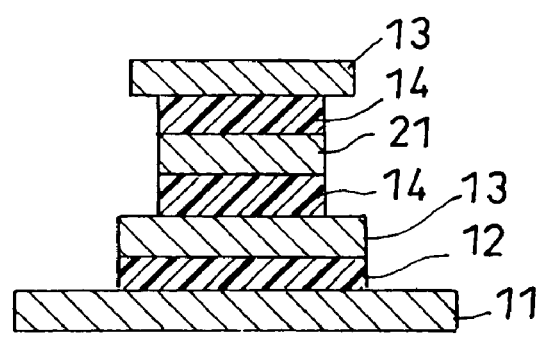

First, as illustrated in FIGS. 3(a) to 3(c), an adhesive sheet 12, a semiconductor element 13 and an adhesive sheet 14 are successively laminated and pre-stuck/fixed onto a substrate 11 or the like in the same way as in the embodiment 2. Furthermore, on the adhesive sheet 14, a spacer 21, another adhesive sheet 14 and another semiconductor element 13 are successively laminated and pre-stuck/fixed (see FIGS. 3(d) to 3(f)).

Figure 3G:
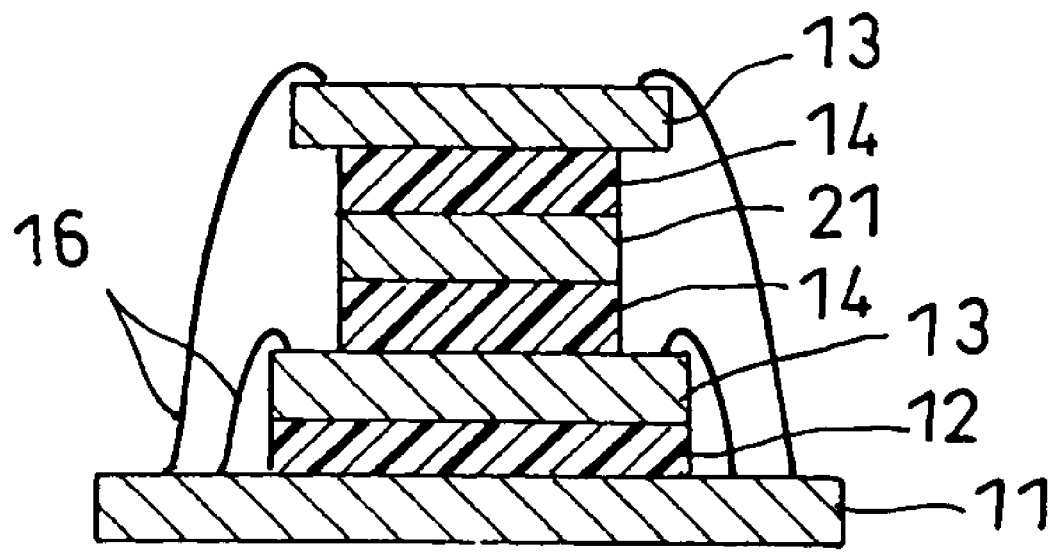

Next, as illustrated in FIG. 3(g), a wire bonding step is carried out without performing any heating step, thereby electrically connecting electrode pads of the semiconductor elements 13 to the substrate 11 or the like through bonding wires 16.

Next, a sealing step of sealing the semiconductor elements with a sealing resin is performed to cure the sealing resin and further stick/fix the substrate 11 or the like onto one of the semiconductors element 13 and stick/fix the other semiconductor element 13 onto the spacer 21 through the adhesive sheets 12 and 14. After the sealing step, a post-curing step may be performed. The above-mentioned producing process makes it possible to yield a semiconductor device according to the present embodiment.

The spacer is not limited to any especial kind, and may be a spacer known in the prior art, such a silicon chip or a polyimide film.

(Embodiment) 4

A process for producing a semiconductor device according to embodiment 4 is described with reference to FIGS. 4(a) to 4(e), which are process charts for explaining this process.

Figure 4A:
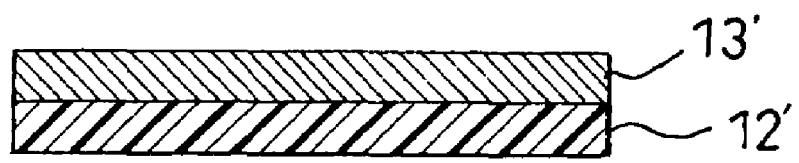
FIGS. 4($a$) to 4($e$) are process charts for explaining a process for producing a semiconductor device according to embodiment 4 of the present invention.
Figure 4B:
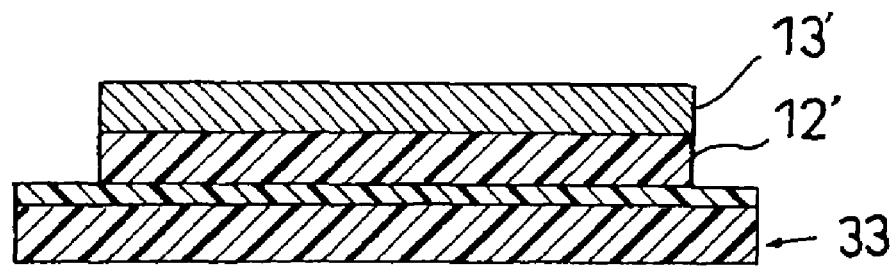
Figure 4C:
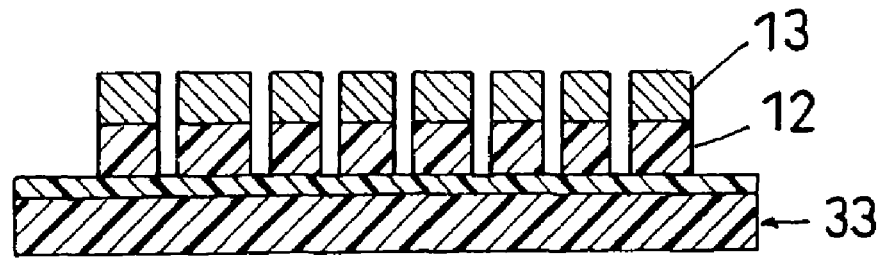

First, as illustrated in FIG. 4(a), an adhesive sheet 12' is stuck onto the rear face of a semiconductor wafer 13' to form a semiconductor wafer with the adhesive sheet. Next, a dicing tape 33 is pre-stuck/fixed onto the semiconductor wafer 13' (see FIG. 4(b)). The semiconductor wafer with the adhesive sheet is then diced into chips each having a given size (see FIG. 4(c)). The chips with the adhesive are peeled from the dicing tape 33.

Figure 4D:
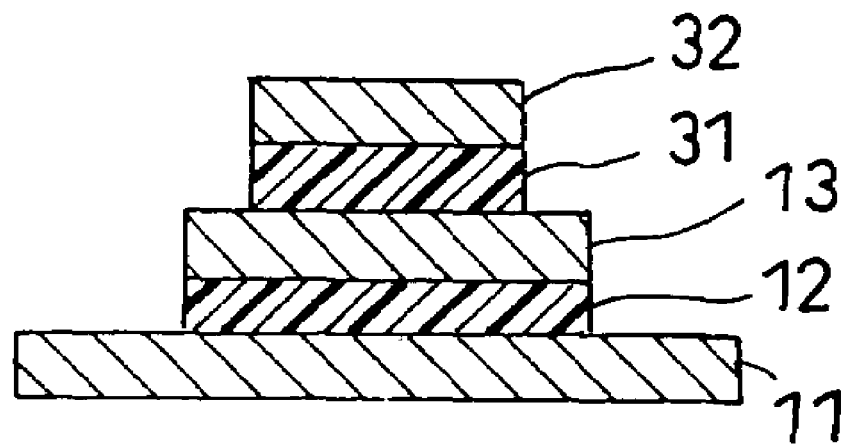

Next, as illustrated in FIG. 4(d), one 13 of the semiconductor elements with an adhesive sheet 12 is pre-stuck/fixed onto a substrate 11 or the like in such a manner that the wire bonding face thereof is directed upwards. A semiconductor element 32, which has a different size from that of the semiconductor element 13 and has an attached adhesive sheet 31, is pre-stuck/fixed onto the semiconductor element 13 in such a manner that the wire bonding face thereof is directed upwards.

Figure 4E:
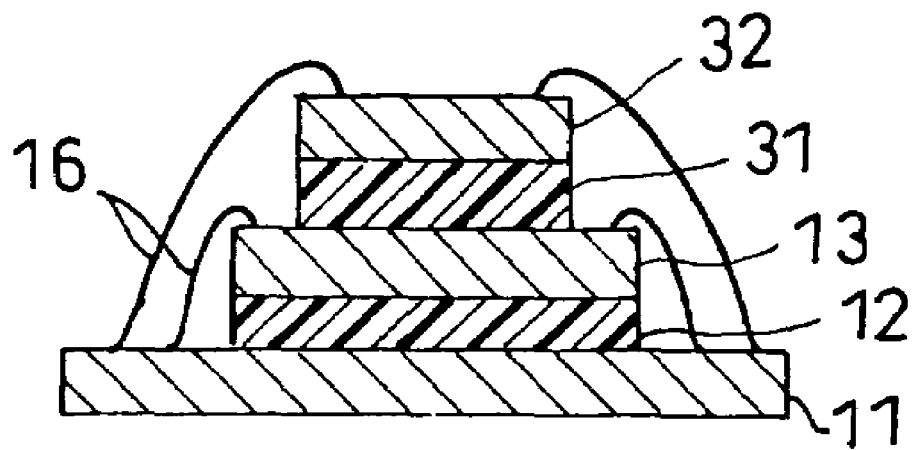

Next, as illustrated in FIG. 4(e), a wire bonding step is carried out without performing any heating step, thereby electrically connecting electrode pads of the semiconductor elements 13 and 32 to the substrate 11 or the like through bonding wires 16.

Next, a sealing step of sealing the semiconductor elements with a sealing resin is performed to cure the sealing resin and further to stick/fix the substrate 11 or the like onto the semiconductor 13 and stick/fix the semiconductor element 13 onto the semiconductor element 32 through the adhesive sheet pieces 12 and 31. After the sealing step, a post-curing step may be performed. The above-mentioned producing process makes it possible to yield a semiconductor device according to the present embodiment.

(Embodiment) 5

A process for producing a semiconductor device according to Embodiment 5 is described with reference to FIGS. 5(a) to 5(e), which are process charts for explaining this process.

The semiconductor device producing process according to the present embodiment is different from the semiconductor device producing process according to the embodiment 4 in that an adhesive sheet 12' is laminated onto a dicing tape 33 and subsequently a semiconductor wafer 13' is laminated onto the adhesive sheet 12'.

Figure 5A:
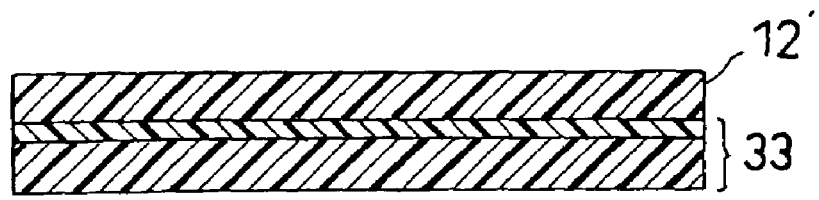
FIGS. 5($a$) to 5($e$) are process charts for explaining a process for producing a semiconductor device according to embodiment 5 of the present invention.
Figure 5B:
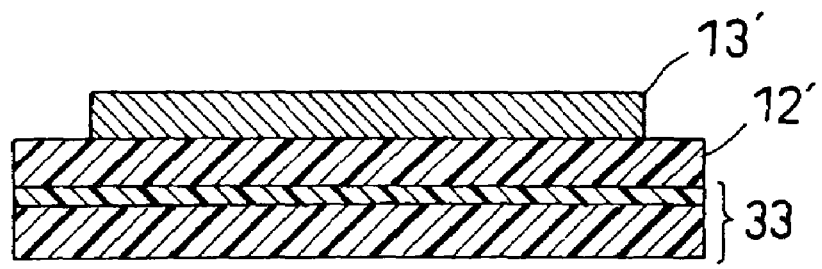
Figure 5C:
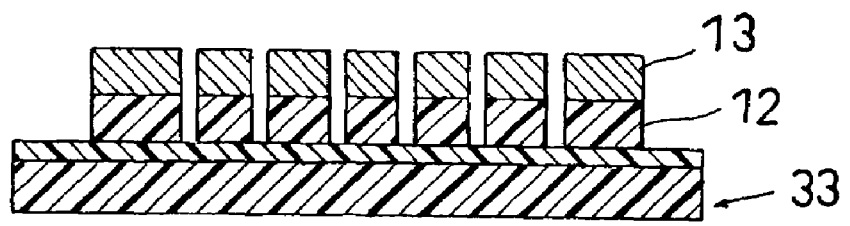

First, as illustrated in FIG. 5(a), an adhesive sheet 12' is laminated onto a dicing tape 33. A semiconductor wafer 13' is then laminated onto the adhesive sheet 12' (see FIG. 5(b)). The semiconductor wafer with the adhesive sheet is then diced into chips each having a given size (see FIG. 5c)). The chips with the adhesive are peeled from the dicing tape 33.

Figure 5D:
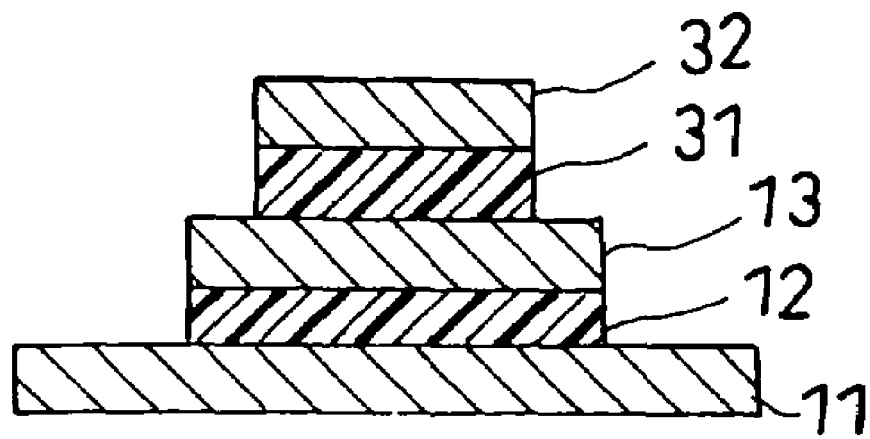

Next, as illustrated in FIG. 5(d), one 13 of the semiconductor elements with an adhesive sheet piece 12 is pre-stuck/fixed onto a substrate 11 or the like in such a manner that the wire bonding face thereof is directed upwards. A semiconductor element 32, which has a different size from that of the semiconductor element 13 and has an attached adhesive sheet 31, is pre-stuck/fixed onto the semiconductor element 13 in such a manner that the wire bonding face thereof is directed upwards. At this time, the sticking/fixing of the semiconductor element 32 is performed to avoid electrode pad portions of the subjacent semiconductor element 13.

Figure 5E:
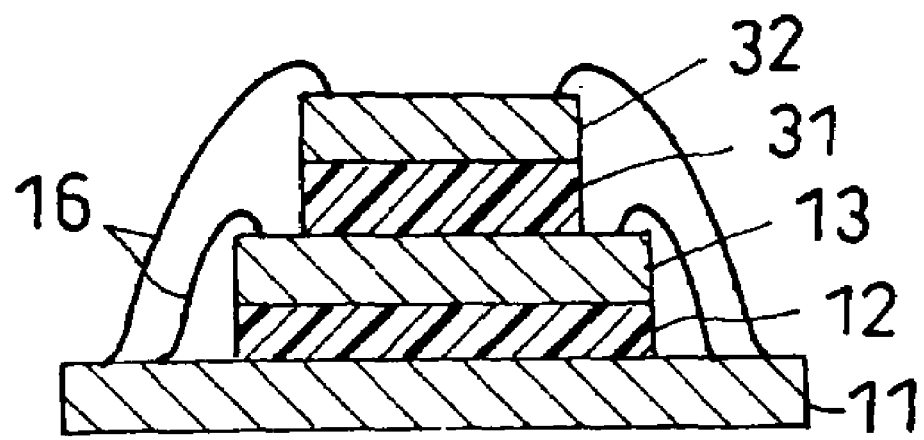

Next, as illustrated in FIG. 5(e), a wire bonding step is carried out without performing any heating step, thereby electrically connecting electrode pads of the semiconductor elements 13 and 32 to lands for internal connection in the substrate 11 or the like through bonding wires 16.

Next, a sealing step of sealing the semiconductor elements with a sealing resin is performed to cure the sealing resin and further to stick/fix the substrate 11 or the like onto the semiconductor element 13 and stick/fix the semiconductor element 13 onto the semiconductor element 32 through the adhesive sheet pieces 12 and 31. After the sealing step, a post-curing step may be performed. The above-mentioned producing process makes it possible to yield a semiconductor device according to the present embodiment.

(Embodiment) 6

Figure 6A:
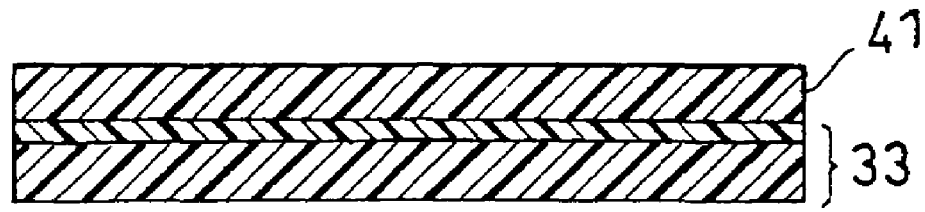
FIGS. 6($a$) to 6($c$) are process charts for explaining a process for producing a semiconductor device according to embodiment 6 of the present invention.
Figure 6B:
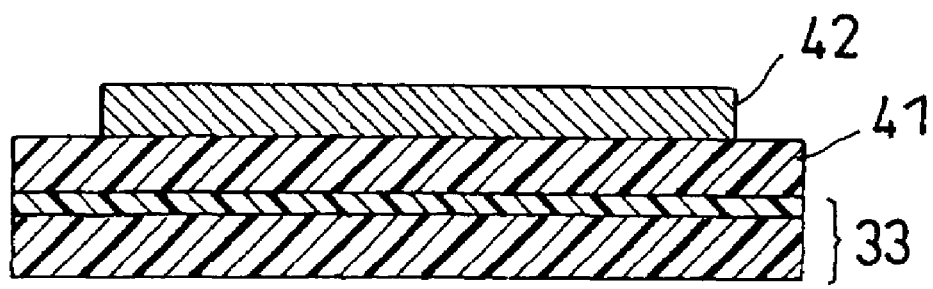
Figure 6C:
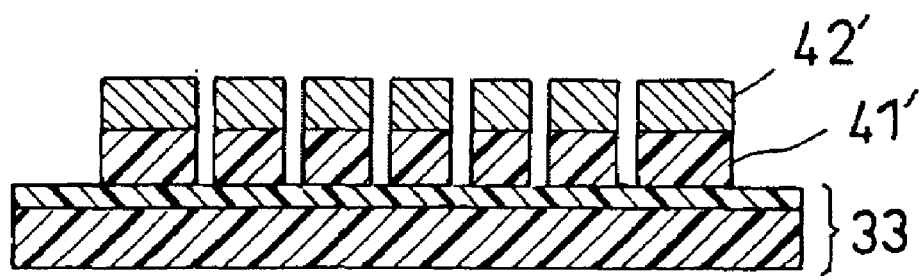
Figure 7:
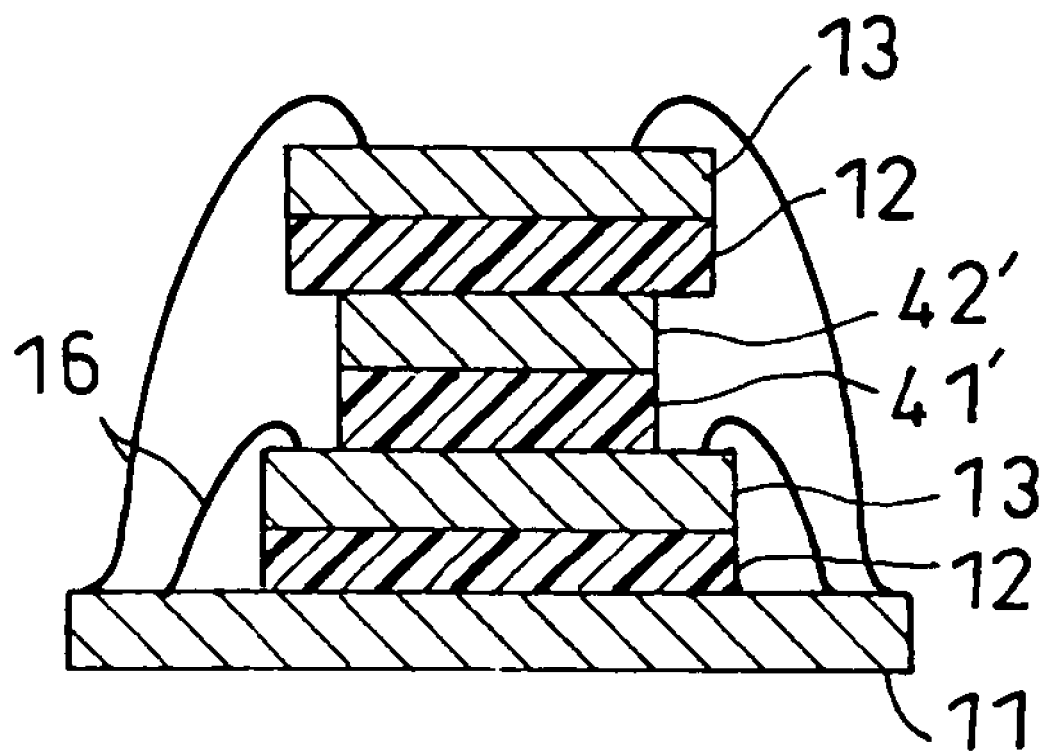
FIG. 7 is a sectional view which schematically illustrates a semiconductor device obtained by the semiconductor device producing process according to embodiment 6.

A process for producing a semiconductor device according to Embodiment 6 is described with reference to FIGS. 6(a) to 6(c) and FIG. 7. FIGS. 6(a) to 6(c) are process charts for explaining this process. FIG. 7 is a sectional view, which schematically illustrates a semiconductor device obtained by the semiconductor device producing process according to the present embodiment.

The semiconductor device according to the present embodiment is different from the semiconductor device according to the embodiment 3 in that a core member is used as a spacer. First, an adhesive sheet 12' is laminated onto a dicing tape 33 in the same way as in the embodiment 5. A semiconductor wafer 13' is then laminated onto the adhesive sheet 12'. The semiconductor wafer with the adhesive sheet is then diced into chips each having a given size. The chips with the adhesive are peeled from the dicing tape 33, thereby yielding semiconductor elements 13 to each of which an adhesive sheet piece 12 is attached.

Separately, an adhesive sheet 41 is formed on a dicing tape 33, and then a core member 42 is attached onto the adhesive sheet 41. The resultant is then diced into chips each having a given size. The chips with the adhesive are peeled from the dicing tape 33, thereby yielding core member pieces 42' which are each in a chip form and each have an attached adhesive sheet piece 41'.

Next, one of the semiconductor elements 13 is pre-stuck/fixed onto a substrate 11 or the like through the adhesive sheet 12 in such a manner that the wire bonding face thereof is directed upwards. Furthermore, one of the core member 42' is pre-stuck/fixed onto the semiconductor element 13 through the adhesive sheet 41'. Another element out of the semiconductor elements 13 is pre-stuck/fixed onto the core member 42' through the adhesive sheet 12 in such a manner that the wire bonding face thereof is directed upwards. The above-mentioned producing process makes it possible to yield a semiconductor device according to the present embodiment.

Next, a wire bonding step is carried out without performing any heating step, thereby electrically connecting electrode pads of the semiconductor elements 13 to lands for internal connection in the substrate 11 or the like through bonding wires 16 (see FIG. 7).

Next, a sealing step of sealing the semiconductor elements with a sealing resin is performed to cure the sealing resin and further to stick/fix the substrate 11 or the like onto one of the semiconductors element 13 and stick/fix the other semiconductor element 13 onto the core member piece 42' through the adhesive sheet 12 and 41'. After the sealing step, a post-curing step may be performed. The above-mentioned producing process makes it possible to yield a semiconductor device according to the present embodiment.

The core member is not limited to any especial kind, and may be a core member known in the prior art. Specific examples of the core member include films (such as polyimide film, polyester film, polyethylene terephthalate film, polyethylene naphthalate film, and polycarbonate film); resin substrates which are reinforced with glass fiber or plastic nonwoven finer; mirror silicon wafers; silicon substrates; and glass substrates.

(Embodiment) 7

Figure 8A:
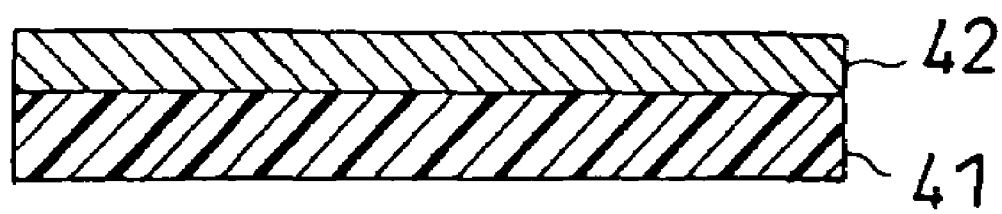
FIGS. 8($a$) and 8($b$) are process charts for explaining a process for producing a semiconductor device according to embodiment 7 of the present invention.
Figure 8B:
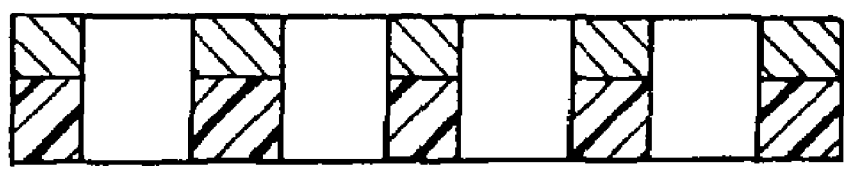
Figure 8B:
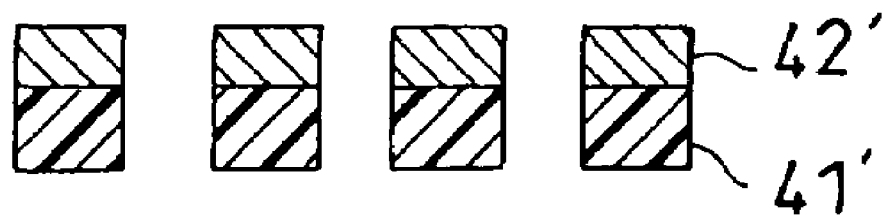

A process for producing a semiconductor device according to Embodiment 7 is described with reference to FIGS. 8(a) and 8(b), which are process charts for explaining this process.

The semiconductor device producing process according to the present embodiment is different from the semiconductor device producing process according to the embodiment 6 in that a core member is made into chips by punching or some other method instead of dicing.

First, semiconductor elements 13 each provided with an adhesive sheet 12 are yielded in the same way as in the embodiment 6. Separately, a core member 42 is attached onto an adhesive sheet 41. The resultant is made into chips each having a given size by punching or some other method. In this way, cores member 42' each of which is in a chip form and provided with an adhesive sheet 41' are yielded.

Next, one of the core member pieces 42' and one of the semiconductor elements 13 are successively laminated on another element out of the semiconductor elements 13 through the adhesive sheet pieces 12 and 41' and then are pre-stuck/fixed in the same way as that of Embodiment 6.

Furthermore, the resultant is subjected to a wire bonding step, a sealing step and an optional post-curing step, so as to yield a semiconductor device according to the present embodiment.

(Other Matters)

When semiconductor elements are three-dimensional mounted onto any one of the above-mentioned substrates, a buffer coat layer may be formed on the substrate surface on which circuits of the semiconductor elements are formed. The buffer coat layer may be, for example, a silicon nitride film, or a layer made of a heat-resistant resin such as polyimide resin.

The compositions of the adhesive sheets used in the respective stages at the time of the three-dimensional mounting of the semiconductor elements may be the same, but not limited thereto, and may be appropriately varied dependently on the producing conditions or use purposes thereof, or the like.

The laminating method of each of the above-mentioned embodiments is a mere example, and may be appropriately changed if necessary. For example, in the semiconductor device producing process according to the embodiment 2, the semiconductor elements in the second stage and higher stages may be laminated by the laminating method described about the embodiment 3.

About the above-mentioned embodiments, there are described embodiments wherein semiconductor elements are laminated on a substrate or the like and subsequently all the elements are subjected to a wire bonding step at a time. However, the present invention is not limited to the embodiments. For example, a wire bonding step may be performed every time when semiconductor elements are laminated on or over a substrate or the like.

The present invention is specifically described by way of the following examples.

EXAMPLE 1

Into methyl ethyl ketone were dissolved 100 parts of an acrylic ester type polymer made mainly of ethyl acrylate and methyl methacrylate (PARACRON W-197CM, manufactured by Negami Chemical Industrial Co., Ltd.), 3 parts of a polyfunctional isocyanate type crosslinking agent, 23 parts of an epoxy resin (Epikote 1004, manufactured by Japan Epoxy Resin Co., Ltd.), and 6 parts of a phenol resin (Milex XLC-CC, manufactured by Mitsui Chemicals, Inc. Chemicals, Inc.), so as to prepare an adhesive composition solution having a concentration of 20% by weight.

This adhesive composition solution was applied onto a release-treated film made of a polyethylene terephthalate film (thickness: 50 µm) treated for release with silicone as a releasing liner. The resultant was then dried at 120° C. for 3 minutes to form an adhesive sheet having a 25 µm of thickness according to Example 1.

EXAMPLE 2

An adhesive sheet (thickness: 50 µm) according to Example 2 was formed in the same way as in Example 1 except that a polymer made mainly of butyl acrylate (PARACRON SN-710, manufactured by Negami Chemical Industrial Co., Ltd.) was used instead of the acrylic ester type polymer used in Example 1.

COMPARATIVE EXAMPLE 1

Into methyl ethyl ketone were dissolved 100 parts of the acrylic ester type polymer made mainly of ethyl acrylate and methyl methacrylate (PARACRON W-197CM, manufactured by Negami Chemical Industrial Co., Ltd.), 23 parts of the epoxy resin (Epikote 1004, manufactured by Japan Epoxy Resin Co., Ltd.), and 6 parts of the phenol resin (Milex XLC-CC, manufactured by Mitsui Chemicals, Inc.), so as to prepare an adhesive composition solution having a concentration of 20% by weight.

This adhesive composition solution was applied onto a release-treated film made of a polyethylene terephthalate film (thickness: 50 µm) treated for release with silicone as a releasing liner. The resultant was then dried at 120° C. for 3 minutes to form an adhesive sheet having a 25 µm of thickness according to Comparative Example 1.

COMPARATIVE EXAMPLE 2

An adhesive sheet (thickness: 25 µm) according to Comparative Example 2 was formed in the same way as in Comparative Example 1 except that the polymer made mainly of butyl acrylate (PARACRON SN-710, manufactured by Negami Chemical Industrial Co., Ltd.) was used instead of the acrylic ester type polymer used in Comparative Example 1.

[Measurement for Shear Adhesive Force]

About each of the adhesive sheets formed in the above-mentioned Examples and Comparative Examples, the shear adhesive force thereof to a substrate, a lead frame or a semiconductor element was measured at the time of pre-sticking/fixing as follows:

First, samples of the substrate, the lead frame and the semiconductor elements were produced as follows:

In the case of the substrate, a substrate (trade name: TFBGA 16×16 (2216-001A01), manufactured by UniMicron Technology Corporation) onto which each of the resultant adhesive sheets, peeled from the separator and cut into a 2 mm square, was stuck/fixed, was used. Separately, a wafer on which aluminum was evaporated was diced to produce a chip having 2 mm long, 2 mm wide and 500 µm thick. This chip was die-attached to the substrate to form a test piece. The die-attaching was performed, using a die bonder (SPA-300, manufactured by Shinkawa Ltd.) by heating at 120° C. for 1 second under an applied load of 0.25 MPa.

In the case of the lead flame, a lead flame (trade name: CA-F313 (MF202), manufactured by Shinko Electric Industries Co., Ltd.) was used to form a test piece in the same way as in the case of the substrate.

In the case of the semiconductor element, each of the resultant adhesive sheets peeled from the separator and cut into a 6 mm square was used. An evaluating element wherein an evaluating model pattern was formed (manufactured by Phoenix Semiconductor Corp., model number: NT-103, passivation layer: $Si_3N_4$ (thickness: 5000 Å)), diced into a piece having 6 mm long, 6 mm wide and 500 µm thick, was die-attached onto a die pad of the lead frame (article name: CA-F313 (MF202), manufactured by Shinko Electric Industries Co., Ltd.). Thereafter, the adhesive sheet cut into a 2 mm square was used to die-attach a chip having 2 mm long, 2 mm wide and 500 µm thick diced from an aluminum-evaporated wafer onto the evaluating element so as to form a test piece. The die attaching was performed under the same conditions as in the case of the substrate and the lead frame.

The shear adhesive force of each of the samples was measured by fixing the sample onto a hot plate, the temperature of which was able to be controlled, and pushing the die-attached semiconductor element horizontally at a speed of 0.1 mm/second with a push-pull gauge. The measurement was made at hot plate temperatures of 80, 175 and 250° C. A used device for the measurement was a device, Model-2252 (manufactured by Aikoh Engineering Co., Ltd.). After the die-attaching, the sample was subjected to no heating step. In the case of the semiconductor element, the aluminum-evaporated semiconductor element of a 2 mm square was pushed with a push-pull gauge so as to measure the shear adhesive force thereof.

The results are shown in Table 1.

TABLE 1

| | Shear adhesive force (MPa) without heating step | | | | | | | | |
| --- | --- | --- | --- | --- | --- | --- | --- | --- | --- |
| | Lead frame | | | Substrate | | | Semiconductor element | | |
| Hot plate temperature (° C.) | 80 | 175 | 250 | 80 | 175 | 250 | 80 | 175 | 250 |
| Example 1 | 0.4 | 0.3 | 0.2 | 0.4 | 0.3 | 0.2 | 0.5 | 0.4 | 0.3 |
| Example 2 | 0.5 | 0.4 | 0.3 | 0.4 | 0.3 | 0.2 | 0.6 | 0.4 | 0.3 |
| Comparative Example 1 | 0 | 0 | 0 | 0 | 0 | 0 | 0 | 0 | 0 |
| Comparative Example 2 | 0 | 0 | 0 | 0 | 0 | 0 | 0 | 0 | 0 |

As shown in Table 1, the adhesive sheets of Examples 1 and 2 each exhibited a shear adhesive force of 0.2 MPa or more at each of the hot plate temperatures. On the other hand, the shear adhesive forces of the adhesive sheets of Comparative Examples 1 and 2 were each 0 MPa.

[Wire Bondability]

The adhesive sheets of Examples and Comparative Examples were used to evaluate the wire bondability thereof in the case of using a semiconductor element and a lead frame, a substrate, and a semiconductor element.

First, samples of the substrate, the lead frame and the semiconductor element were produced as follows:

In the case of the substrate, a substrate (trade name: TFBGA 16×16 (2216-001A01), manufactured by UniMicron Technology Corporation) onto which each of the resultant adhesive sheets, peeled from the separator and cut into a 6 mm square, was stuck/fixed was used. Separately, an aluminum-evaporated wafer was diced to produce a chip having 6 mm long, 6 mm wide and 100 μm thick. This chip was die-attached to the substrate to form a test piece. The die-attaching was performed, using the die bonder (SPA-300, manufactured by Shinkawa Ltd.) by heating at 120° C. for 1 second under an applied load of 0.25 MPa.

In the case of the lead flame, a lead frame (trade name: CA-F313 (MF202), manufactured by Shinko Electric Industries Co., Ltd.) onto which each of the resultant adhesive sheets, peeled from the separator and cut into a 7.5 mm square, was stuck/fixed was used. Separately, an aluminum-evaporated wafer was diced to produce a chip having 7.5 mm long, 7.5 mm wide and 100 μm thick. This chip was die-attached to the lead frame to form a test piece. The die-attaching was performed under the same conditions as in the case of the substrate.

In the case of the semiconductor element, each of the resultant adhesive sheets peeled from the separator and cut into a 6 mm square was used. An evaluating element wherein an evaluating model pattern was formed (manufactured by Phoenix Semiconductor Corp., model number: NT-103, passivation layer: $Si_3N_4$ (thickness: 5000 Å)), diced into a piece having 6 mm long, 6 mm wide and 100 μm thick, was die-attached onto a die pad of a lead frame (article name: CA-F313 (MF202), manufactured by Shinko Electric Industries Co., Ltd.). This evaluating element was referred to as a first semiconductor element. Next, each of the adhesive sheets cut into a 5 mm square was used to die-attach a chip having 5 mm long, 5 mm wide and 100 μm thick diced from an aluminum-evaporated wafer onto the above-mentioned evaluating element so as to form a test piece. This chip was referred to as a second semiconductor element. Finally, 20 pieces of each of the samples of the above-mentioned kinds were formed.

Next, gold lines (diameter: 25 μm) for wire bonding were bonded onto each of the samples by an ultrasonic thermal pressing method. The number of the wire bonds per sample was 80. Conditions for the wire bonding were as follows: an ultrasonic outputting time of 10 ms, an ultrasonic output of 120, a bonding load of 980 mN, and stage temperatures of 80, 175 and 250° C. A used device for the wire bonding was a device, UTC-300 (manufactured by Shinkawa Ltd.). About the evaluation of the success ratio of the wire bonding, a case in which a pull strength of 5 g or more was obtained according to a tension gauge was regarded as a success. No sample was subjected to any heating step after the die attaching. In the case of the semiconductor element, the second semiconductor element and the lead frame were wire-bonded.

The results are shown in Table 2.

TABLE 2

| | Wire bonding success ratio (%) without heating step | | | | | | | | |
| --- | --- | --- | --- | --- | --- | --- | --- | --- | --- |
| | Lead frame | | | Substrate | | | Semiconductor element | | |
| Wire bonding temperature (° C.) | 80 | 175 | 250 | 80 | 175 | 250 | 80 | 175 | 250 |
| Example 1 | 100 | 100 | 100 | 100 | 100 | 100 | 100 | 100 | 100 |
| Example 2 | 100 | 100 | 100 | 100 | 100 | 100 | 100 | 100 | 100 |
| Comparative Example 1 | 0 | 0 | 0 | 0 | 0 | 0 | 0 | 0 | 0 |
| Comparative Example 2 | 0 | 0 | 0 | 0 | 0 | 0 | 0 | 0 | 0 |

As is shown in Table 2, about the adhesive sheets of Examples 1 and 2, the success ratios thereof were 100% about each of the hot plate temperatures. On the other hand, about the adhesive sheets of Comparative Examples 1 and 2, the success ratios thereof were 0%. The reason why the success ratios of the adhesive sheets of Examples 1 and 2 were 100% is that the chips were not out of position since each of the sheets had sufficient shear adhesive force.

The specific embodiments and examples described in the item "DESCRIPTION OF THE EMBODIMENTS" are merely embodiments and examples for making the technical content of the present invention clear. Thus, the invention should not be interpreted in a narrow sense so as to be limited to such specific examples. The invention can be modified within the scope of the spirit of the invention and the following claims.

What is claimed is:

1. A process for producing a semiconductor device, comprising:
   a pre-sticking/fixing step of pre-sticking/fixing a semiconductor element through an adhesive sheet to an object to which the semiconductor element is to be stuck/fixed, and
   a wire bonding step of performing wire bonding without heating step,
   wherein the shear adhesive force of the adhesive sheet to the object is 0.2 MPa or more at the time of the pre-sticking/fixing.

2. The process for producing the semiconductor device according to claim 1, wherein the object is a substrate, a lead frame or a semiconductor element.

3. The process for producing the semiconductor device according to claim 1, comprising a sealing step of sealing the semiconductor element with a sealing resin, and a post-curing step of post-curing the sealing resin,
   wherein the sealing resin is cured by heating and further the semiconductor element is stuck/fixed to the object through the adhesive sheet in the sealing step and/or the post-curing step.

4. The process for producing the semiconductor device according to claim 2, comprising, when the object is a semiconductor element, the step of inserting a spacer between this semiconductor element and the above-mentioned semiconductor element in such a manner that the adhesive sheet is interposed between each of the semiconductor elements and the spacer,
   wherein the shear adhesive force of the adhesive sheet to the spacer or the semiconductor element is 0.2 MPa or more at the time of the pre-sticking/fixing.

5. The process for producing the semiconductor device according to claim 4, wherein a sealing resin is cured by heating and further the semiconductor element is stuck/fixed to the spacer through the adhesive sheet in the sealing step and/or the post-curing step.

6. The process for producing the semiconductor device according to claim 1, wherein the wire bonding step is performed at a temperature in the range of 80 to 250° C.

7. The process for producing the semiconductor device according to claim 1, wherein a sheet comprising a thermoplastic resin is used as the adhesive sheet.

8. The process for producing the semiconductor device according to claim 7, wherein an acrylic resin is used as the thermoplastic resin.

9. The process for producing the semiconductor device according to claim 7, wherein a sheet comprising a crosslinking agent is used as the adhesive sheet.

10. The process for producing the semiconductor device according to claim 1, wherein a sheet comprising both of a thermosetting resin and a thermoplastic resin is used as the adhesive sheet.

11. The process for producing the semiconductor device according to claim 9, wherein an acrylic resin is used as the thermoplastic resin.

12. The process for producing the semiconductor device according to claim 9, wherein an epoxy resin and/or a phenol resin is/are used as the thermosetting resin.

13. The process for producing the semiconductor device according to claim 10, wherein a sheet to which a crosslinking agent is added is used as the adhesive sheet.

14. An adhesive sheet used in a process for producing a semiconductor device,
   said process comprises a pre-sticking/fixing step of pre-sticking/fixing a semiconductor element through the adhesive sheet to an object to which the semiconductor element is to be stuck/fixed, and a wire bonding step of performing wire bonding without heating step,
   wherein the shear adhesive force of the adhesive sheet to the object is 0.2 MPa or more at the time of the pre-sticking/fixing.

15. A semiconductor device obtained by a semiconductor device producing process,
   said process comprises a pre-sticking/fixing step of pre-sticking/fixing a semiconductor element through an adhesive sheet to an object to which the semiconductor element is to be stuck/fixed, and a wire bonding step of performing wire bonding without heating step,
   wherein a sheet having a shear adhesive force of 0.2 MPa or more to the object at the time of the pre-sticking/fixing is used as the adhesive sheet in said semiconductor device producing process.

* * * * *

UNITED STATES PATENT AND TRADEMARK OFFICE
CERTIFICATE OF CORRECTION

| | |
|---|---|
| PATENT NO. | : 7,232,709 B2 |
| APPLICATION NO. | : 11/012377 |
| DATED | : June 19, 2007 |
| INVENTOR(S) | : Sadahito Misumi et al. |

It is certified that error appears in the above-identified patent and that said Letters Patent is hereby corrected as shown below:

Column 5, Line 64, before "this" please delete "the".

Column 7, Lines 29-30 (approximately), please delete

"tris-glycicylisocyanurate" and insert -- tris-glycidylisocyanurate --, therefor.

Signed and Sealed this

Twentieth Day of May, 2008

JON W. DUDAS
*Director of the United States Patent and Trademark Office*